(12) United States Patent
Schendel

(10) Patent No.: US 6,253,556 B1
(45) Date of Patent: Jul. 3, 2001

(54) ELECTRICAL SYSTEM WITH COOLING OR HEATING

(75) Inventor: Robert E. Schendel, Kingwood, TX (US)

(73) Assignee: Texas Components Corporation, Houston, TX (US)

( * ) Notice: Subject to any disclaimer, the term of this patent is extended or adjusted under 35 U.S.C. 154(b) by 0 days.

(21) Appl. No.: 09/544,193

(22) Filed: Apr. 6, 2000

(51) Int. Cl.7 .................................................. F25B 21/02
(52) U.S. Cl. .................. 62/3.7; 62/3.3; 361/688
(58) Field of Search ................. 62/3.7, 3.2, 3.3, 62/3.6, 259.2; 323/303; 361/676, 688, 697; 136/203, 204

(56) References Cited

U.S. PATENT DOCUMENTS

| | | | |
|---|---|---|---|
| 2,984,077 | 5/1961 | Gaskill | 62/3 |
| 4,812,733 | * 3/1989 | Tobey . | |
| 4,838,032 | * 6/1989 | Maslaney et al. . | |
| 5,079,618 | 1/1992 | Farnworth | 357/81 |
| 5,724,818 | 3/1998 | Iwata | 62/3.7 |
| 5,887,435 | 3/1999 | Morton | 62/3.6 |
| 5,931,000 | 8/1999 | Turner et al. | 62/3.2 |
| 6,082,115 | * 7/2000 | Strnad . | |

* cited by examiner

Primary Examiner—Michael Powell Buiz
Assistant Examiner—Chen-Wen Jiang
(74) Attorney, Agent, or Firm—McGlinchey Stafford; Clarence E. Erikson

(57) ABSTRACT

An electrical system is disclosed which includes a supply voltage and electronic circuitry which requires an operational voltage that is less than the supply voltage. A thermoelectric heat pump is interposed between the supply voltage and the electronic circuitry to produce heating or cooling using the excess power which would otherwise be dissipated in a regulator. A voltage regulator is provided between the output of the thermoelectric heat pump and the electronic circuitry to provide the operational voltage to the electronic circuitry.

4 Claims, 1 Drawing Sheet

ELECTRICAL SYSTEM WITH COOLING OR HEATING

BACKGROUND OF THE INVENTION

1. Field of the Invention

The present invention is used in systems where the source of power for low voltage electronics is a high voltage power supply.

2. Description of the Prior Art

In certain applications, the source of power for electronic circuitry is substantially higher than the operational voltage required by the electronic circuitry. For example, in aircraft, the available power supply voltage may be +28 volts, while the operational voltage for the electronic circuitry is +5 volts or +3.3 volts. As illustrated in FIG. 1, such systems usually employ a voltage regulator 10 interposed between the supply voltage 11 and the electronic circuitry 12 to provide the proper operating voltage to the electronic circuitry 12. When, for example, the supply voltage 11 is +28 volts and the operational voltage of the electronic circuitry 12 is +5 volts, the regulator 10 includes suitable circuitry which drops the supply voltage by 23 volts.

The type of regulator which is often used in such systems is a linear regulator. The large voltage difference between the supply voltage and the operating voltage of the electronic circuitry multiplied by the current consumed by the electronic circuitry results in a large amount of power being generated as heat in the regulator, and this power is essentially wasted. While the above-described heating problem may be overcome by use of a switching type regulator, such switching regulators are not always reliable at high operating temperatures, such as those encountered in downhole or jet aircraft applications.

A thermoelectric heat pump, which is commonly known as a Peltier thermoelectric heat pump, is a device that is semiconductor based, and the use of thermoelectric heat pumps to heat or cool electronic circuitry has been disclosed in U.S. Pat. Nos. 5,931,000; 5,079,618; 5,724,818; 2,984,077; and 5,887,435. However, none of the devices in the foregoing patents describe a system where the thermoelectric heat pump is driven by power that would otherwise be wasted. This advantageous result has been achieved by the apparatus of the present invention.

SUMMARY OF THE INVENTION

In accordance with the present invention, an electrical system is provided which includes a supply voltage and electronic circuitry which requires an operational voltage that is less than the supply voltage. A thermoelectric heat pump which has two terminals is interposed between the supply voltage and the electronic circuitry, with one of the terminals of the thermoelectric heat pump being operatively connected to the supply voltage and the other terminal operatively connected to the electronic circuitry. The current flowing in the thermoelectric heat pump causes heating or cooling to be provided to the electronic circuitry, depending on the direction of the current flow. The thermoelectric heat pump is designed such that the voltage which is dropped across the heat pump is less than the difference between the supply voltage and the operational voltage of the electronic circuitry. An electric system in accordance with the present invention also includes a regulator having an input and an output. The input to the regulator is operatively connected to the second terminal of the thermoelectric heat pump, and the output of the regulator is connected to the electronic circuit to supply power to the electronic circuit. The amount of heat which is dissipated in this regulator is small, because the regulator does not have a large voltage differential across it.

With the foregoing arrangement, the amount of power that would otherwise be wasted is utilized by the thermoelectric heat pump to cool or to heat the electronic devices in the electronic circuit.

DESCRIPTION OF SPECIFIC EMBODIMENTS

Figure 1:
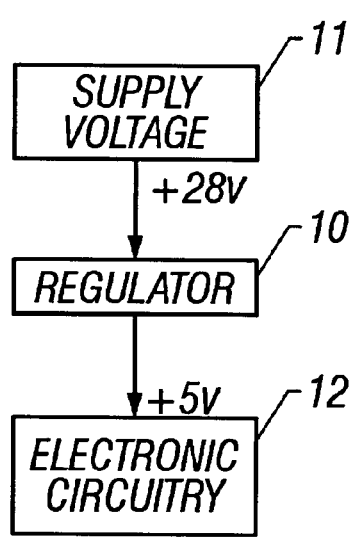
FIG. 1 is a schematic diagram in block diagram form of an embodiment of a prior art electrical system.
Figure 2:
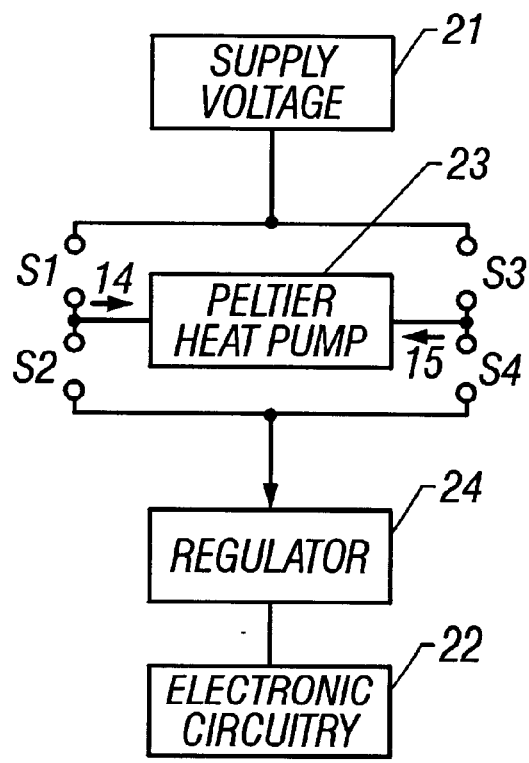
FIG. 2 is a schematic diagram in block diagram form of an embodiment of the electrical system of the present invention.

With reference to FIG. 2, there is illustrated in block diagram form a schematic diagram of an electrical circuit in accordance with the present invention. This electrical circuit includes a supply voltage 20 and electronic circuitry 22. The operational voltage of electronic circuitry 22 is less than the magnitude of the supply voltage 21.

Interposed between supply voltage 21 and electronic circuitry 22 is a thermoelectric heat pump 23, which is also commonly known as a Peltier heat pump. Peltier heat pump 23 is designed such that when current flows through it, the voltage drop across Peltier heat pump 23 will be less than the difference between supply voltage 21 and the operational voltage of electronic circuitry 22. For example, if supply voltage 21 is +28 volts (such as commonly encountered in aircraft), and if the operational voltage for electronic circuitry is +5 volts, then Peltier heat pump 23 is designed such that when current flows through it, the voltage drop across Peltier heat pump 23 will be less than 23 volts. For example, Peltier heat pump 23 may be designed such that when current flows through it, the voltage drop across Peltier heat pump 23 is 20 volts. In this example, the input voltage to regulator 24 would be +8 volts.

It is known that Peltier heat pump 23 will produce a cooling effect when current is passed through it in one direction, and that Peltier heat pump 23 will produce a heat effect when current is passed through it in the reverse direction. The electrical circuit of the present invention also includes four switches S1, S2, S3 and S4, as illustrated in FIG. 2. When switches S1 and S4 are closed, switches S2 and S3 are open. In this situation, current flows through Peltier heat pump 23 in the direction indicated by arrow 14. On the other hand, when switches S2 and S3 are closed, switches S1 and S4 are open and current flows through Peltier heat pump 23 in the direction indicated by arrow 15.

The output of Peltier heat pump 23 is connected to the input of regulator 24, which functions to provide an operational voltage to electronic circuitry 22. By using the Peltier heat pump 23, the amount of excess power dissipated in regulator 24 is substantially minimized.

Figure 3:
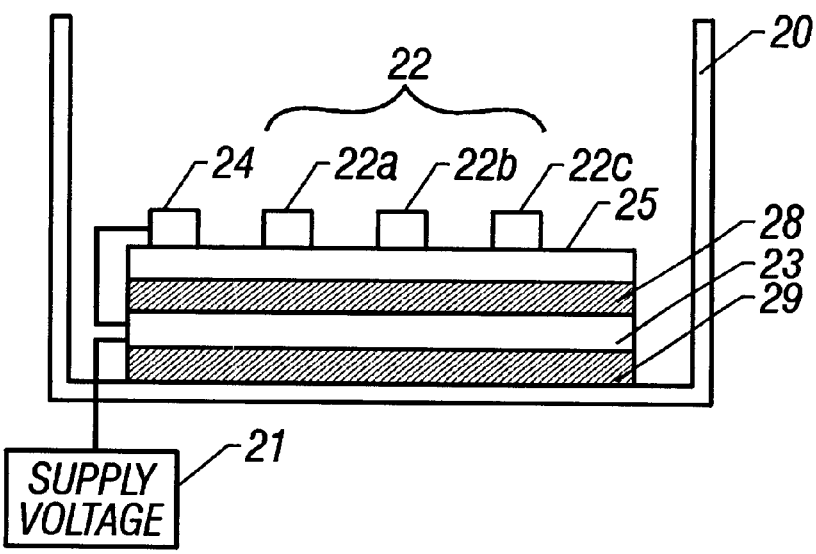
FIG. 3 is a cross-sectional view which illustrates one implementation of an apparatus in accordance with the present invention.

With reference now to FIG. 3, an embodiment of the present invention may, for example, be implemented by installing it in enclosure 20, which is preferably made of a thermally conductive material. Peltier heat pump 23 is installed in enclosure 20 by disposing a highly thermal conductive epoxy 29 between Peltier heat pump 23 and enclosure 20. Circuit board 25 may, for example, be fabricated from a ceramic material, and the circuit elements, e.g., 22a, 22b and 22c, comprising electronic circuitry 22 are installed on circuit board 25, along with regulator 24. A layer of highly thermal conductive epoxy 28 is disposed between circuit board 25 and Peltier heat pump 23.

What is claimed is:

1. An electrical system comprising:

a supply voltage;

an electronic circuit which requires an operational voltage which is less than the supply voltage;

a thermoelectric heat pump which has two terminals, the first of said terminals being operatively connected to the supply voltage; and a regulator having an input and an output, the input of the regulator being operatively connected to the second terminal of the thermoelectric heat pump and the output of the regulator being operatively connected to the electronic circuit to supply operational power to the electronic circuit.

2. The electrical system of claim 1, wherein the thermoelectric heat pump is connected to provide cooling to the electronic circuit.

3. The electrical system of claim 1, wherein the thermoelectric heat pump is connected to provide heating to the electronic circuit.

4. The electrical system of claim 1, further comprising:

a switching arrangement to connect the thermoelectric heat pump either to provide cooling or to provide heating to the electronic circuit.

* * * * *